(12) United States Patent
Lee et al.

(10) Patent No.: US 6,465,147 B1
(45) Date of Patent: Oct. 15, 2002

(54) CROSS-LINKER FOR PHOTORESIST, AND PROCESS FOR FORMING A PHOTORESIST PATTERN USING THE SAME

(75) Inventors: Geun Su Lee; Jae Chang Jung; Min Ho Jung; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/468,984

(22) Filed: Dec. 21, 1999

(30) Foreign Application Priority Data

Dec. 31, 1998 (KR) .............................................. 98-63791

(51) Int. Cl.[7] .......................... G03C 1/73; G03F 7/038; G03F 7/20; G03F 7/30
(52) U.S. Cl. ................... 430/270.1; 430/325; 430/905; 430/914; 430/921; 430/925
(58) Field of Search ............................... 430/270.1, 905, 430/914, 325, 319, 921, 925

(56) References Cited

U.S. PATENT DOCUMENTS

| 5,382,610 | A | * | 1/1995 | Harada et al. ................ 524/35 |
| 5,451,559 | A | * | 9/1995 | Smith et al. ................ 503/200 |
| 6,103,449 | A | * | 8/2000 | Sato ........................ 430/270.1 |

* cited by examiner

Primary Examiner—Janet Baxter
Assistant Examiner—Sin J. Lee
(74) Attorney, Agent, or Firm—Townsend and Townsend and Crew LLP

(57) ABSTRACT

The present invention relates to a cross-linker for a photoresist polymer, and a process for forming a negative photoresist pattern by using the same. Preferred cross-linkers according to the invention comprise compounds having two or more aldehyde groups, such as glutaric dialdehyde, 1,4-cyclohexane dicarboxaldehyde, or the like.

Further, a photoresist composition is disclosed, which comprises (i) a cross-linker as described above, (ii) a photoresist copolymer comprising a hydroxyl-containing alicyclic monomer, (iii) a photoacid generator and (iv) an organic solvent, as well as a process for forming a photoresist pattern using such photoresist composition.

19 Claims, 3 Drawing Sheets

CROSS-LINKER FOR PHOTORESIST, AND PROCESS FOR FORMING A PHOTORESIST PATTERN USING THE SAME

FIELD OF THE INVENTION

The present invention relates to a cross-linking agent ("cross-linker") for a negative photoresist, and a process for forming a negative photoresist pattern by using the same.

BACKGROUND OF THE INVENTION

At present, most of the photoresist patterns used in a lithography process employing a light source of extremely short wavelength (250 nm or less) are positive types. However, "ID bias"—i.e., the difference in CD (Critical Dimension) between an isolated line and a dense line in a photolithography pattern using the same exposing condition—becomes important as semi-conductor devices shrink greatly in size. Accordingly, it is important to reduce ID bias in order to produce a device suitable for light sources with wavelengths of 130 nm or less. It is preferable to use a negative photoresist so as to reduce ID bias. However, it is not easy to prepare a polymer that is suitable for negative photoresists, and photoresist compositions thereof, for the following reasons:

(1) In order to prepare a negative photoresist composition, a photoresist polymer must be selected that has one or more functional group(s) that readily form cross-links in exposed regions and hardly forms cross-links in non-exposed regions. However, this selection is not easy.

(2) In the case of a negative photoresist composition, the photoresist polymer should become cross-linked upon light exposure. However, it is difficult to select an appropriate cross-linker which has such a function. For example, conventional cross-linkers absorb too much energy in the extremely short wavelength region of the light spectrum, in particular ArF radiation (193 nm).

(3) In order to reduce the production cost, conventional alkaline developing solution may be used in the developing process, but a negative photoresist composition generally has low solubility in the alkaline solution. Thus, it is difficult to form a minute pattern.

SUMMARY OF THE INVENTION

The object of the present invention is to provide negative photoresist compositions which are suitably used in a photolithography process employing a light source of extremely short wavelength, in particular, an ArF light source.

Another object of the present invention is to provide photoresist copolymers and cross-linkers that are suitable for preparing the negative photoresist composition.

Still another object of the present invention is to provide processes for preparing ultra-micro patterns using the photoresist composition.

In order to achieve these objects, the present invention provides a cross-linker having two or more aldehyde groups.

In addition, the invention provides a photoresist composition which comprises (i) a photoresist polymer comprising one or more alicyclic monomer(s) having hydroxyl group(s) (ii) a cross-linker having aldehyde groups, (iii) a photoacid generator and (iv) an organic solvent.

DETAILED DESCRIPTION OF THE INVENTION

Figure 1:
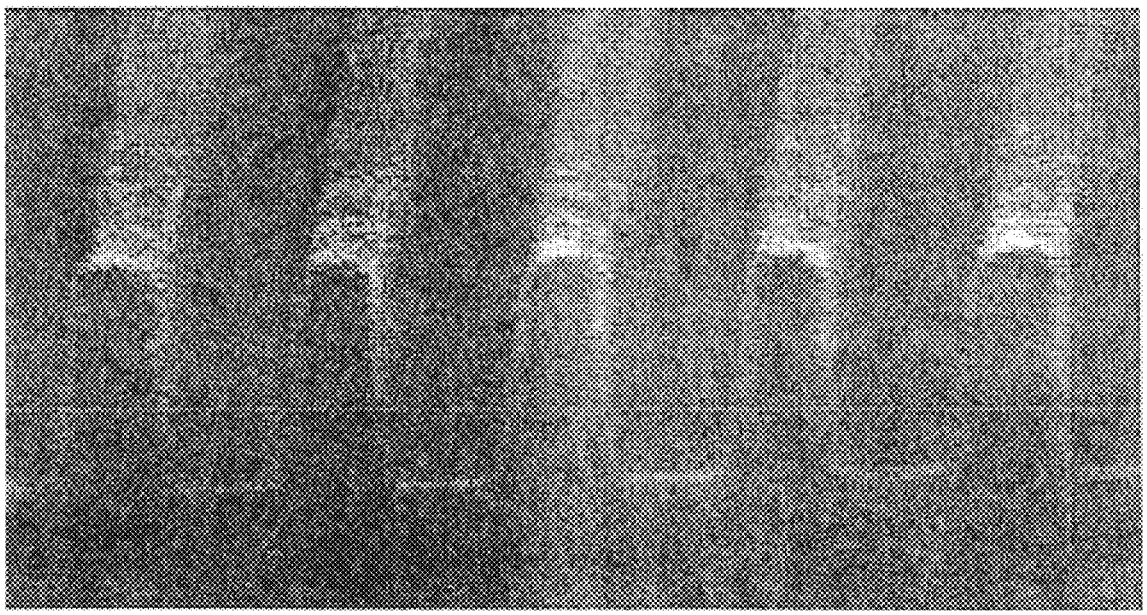
FIG. 1 shows a photoresist pattern obtained from Example 17.

The present inventors have performed intensive studies to achieve the above objects of the invention, and found that, if a polymer having a hydroxyl group is reacted with a polymer having an aldehyde group in the presence of an acid catalyst, the hydroxyl group and aldehyde group effectively form a cross-linkage of the polymers, as illustrated in following Reaction Scheme 1 and 2:

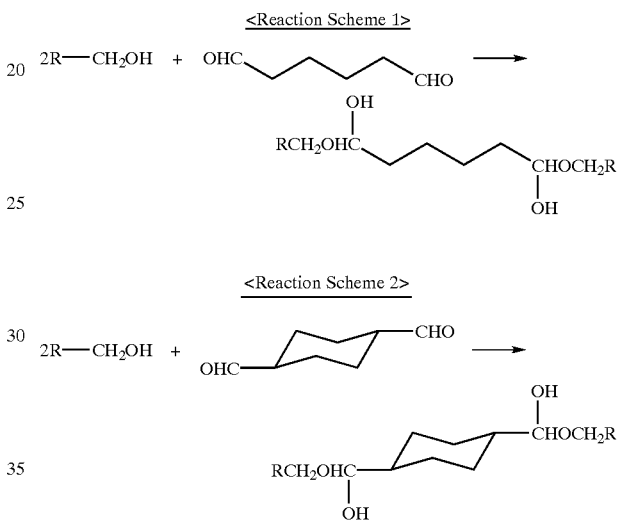

wherein, $2R-CH_2OH$ represents a polymer having hydroxyl group.

Thus, an excellent negative photoresist composition can be prepared by providing a photoresist polymer containing hydroxyl group(s), and mixing the polymer with a cross-linker having two or more aldehyde groups. Upon exposure, acid is generated by a photoacid generator in the photoresist composition, thereby inducing cross-linking between the photoresist polymer and cross-linker in the exposed area, as illustrated in following Reaction Scheme 3. There is no acid generation in the unexposed area (and therefore no cross-linking is induced), so that the photoresist in this area is dissolved by an alkaline developing solution in the follow-up developing stage to provide a negative pattern. The photoresist polymer in the unexposed area shows excellent solubility in the alkaline developing solution because it contains hydroxyl groups.

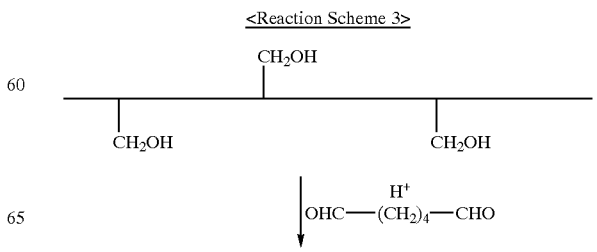

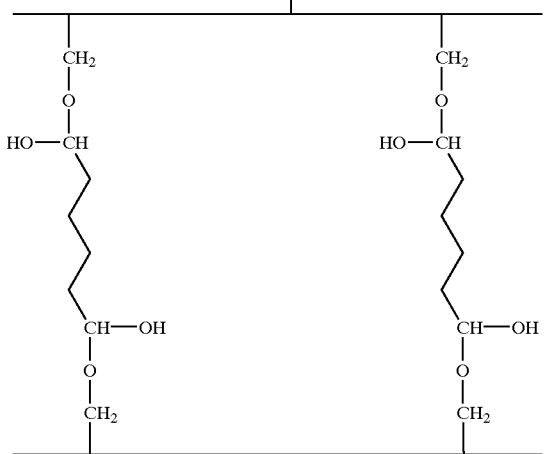

Photoresist cross-linkers

It is contemplated that any compound having two or more aldehyde groups may be used as the photoresist cross-linker according to the present invention. However, preferable cross-linker are represented by following Chemical Formula 1:

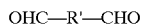
<Chemical Formula 1> wherein, R' represents $C_{1-10}$ aliphatic or alicyclic alkyl.

Examples of preferred compounds of Chemical Formula 1 are glutaric aldehyde and 1,4-cyclohexane dicarboxaldehyde.

Photoresist copoloymer

Photoresist copolymers used in the present invention are prepared from alicyclic monomers having a hydroxyl group, as represented by the following Chemical Formula 2:

<Chemical Formula 2>

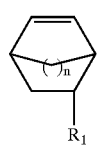

wherein, $R_1$ is $-(CH_2)_p-OH$ or $-COO-(CH_2)_q-OH$; n is the number 1 or 2; p is a number from 1 or 5; and q is a number from 1 to 3.

Preferably, the photoresist copolymers useful in the present invention further comprise maleic anhydride in addition to the monomer(s) of Chemical Formula 2, in order to increase the polymerization yield of each comonomer. A monomer of Chemical Formula 3 may be further added to enhance the photosensitivity.

<Chemical Formula 3>

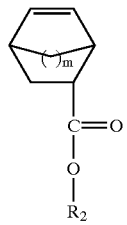

wherein, $R_2$ represents tert-butyl, tetrahydropiranyl, ethoxyethyl, acetoxy ethoxyethyl, tetrahydrofuranyl or acetoxymethyl, and m is 1 or 2.

The most preferred photoresist polymers used in the present invention are represented by the following Chemical Formula 4:

<Chemical Formula 4>

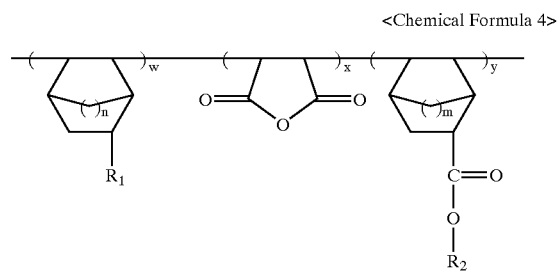

wherein, $R_1$ is $-(CH_2)_p-OH$ or $-COO-(CH_2)_q-OH$; $R_2$ represents tert-butyl, tetrahydropiranyl, ethoxyethyl, acetoxyethoxyethyl, tetrahydrofuranyl or acetoxymethyl; m and n individually represent 1 or 2; p is a number from 1 to 5; q is a number from 1 to 3; and w, x and y individually represent the number of units of each comonomer. Preferably w:x:y=10–48 mol %:50 mol %:2–40 mol %.

The negative photoresist copolymer according to the present invention is prepared by polymerizing the comonomers in the presence of a polymerization initiator and a conventional organic solvent.

The radical polymerization process, bulk polymerization, or solution polymerization may be employed. As the polymerization initiator, 2,2-azobisisobutyronitrile (AIBN), bezoylperoxide, acetylperoxide, laurylperoxide, tert-butyloxide, bis-azide compounds, or the like may be used.

The polymerization solvents which may be used in the present invention include tetrahydrofuran, dimethylformamide, chloroform, ethyl acetate, acetone, ethyl methyl ketone, benzene, toluene, xylene, and the like, with tetrahydrofuran, dioxane or dimethylformamide being the most preferred solvent. In case the polymer is to be obtained in a solid state, diethyl ether, petroleum ether, n-hexane, cyclohexane, methanol, ethanol, propanol or iso-propyl alcohol may be used as the polymerization solvent, with diethyl ether, petroleum ether or n-hexane being the most preferred solvent.

Polymerization is preferably carried out at a temperature of 50° C. to 120° C., more preferably at 50° C. to 80° C., for 4 to 24 hours under a nitrogen or argon atmosphere. Molecular weight of the polymer thus prepared is preferably 3,000 to 20,000.

Preparation of a negative photoresist composition and formation of a micro-pattern by using the same The photoresist composition according to the present invention comprises (i) a photoresist copolymer containing alicyclic monomer(s) having hydroxyl group(s) (ii) a cross-linker having aldehyde groups, (iii) a photoacid generator and (iv) an organic solvent.

Preferably, an aldehyde-containing compound such as glutaric aldehyde or 1,4-cyclohexane dicarboxaldehyde is used as the cross-linker. The amount of the cross-linker is preferably 10 to 30 % by weight of the photoresist copolymer.

Sulfide or onium-type compounds are preferably used as the photoacid generator. For example, the photoacid generator may be one or more compounds selected from the group consisting of diphenyl iodide hexafluorophosphate, diphenyl iodide hexafluoroarsenate, diphenyliodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate. The photoacid generator may be used in an amount of 1 to 20%, preferably 1 to 5%, by weight of the photoresist copolymer. If the amount is less than 1 wt %, photosensitivity of the photoresist may deteriorate, while if the amount is more than 20 wt %, the photoacid generator absorbs too much deep ultraviolet thereby providing a pattern having poor profile.

As an organic solvent, ethyl lactate, ethyl ethoxypropionate, propylene glycol methyl ether acetate, ethyl methyl ketone, methyl 3-methoxypropionate, ethyl ethoxypropionate, 2-ethoxyethyl acetate, or the like may be used. The amount of the organic solvent used is preferably 2 to 8 times, preferably 3 to 6 times the weight of the photoresist polymer employed.

In order to form a photoresist pattern using the photoresist composition thus prepared, the photoresist composition is spin-coated on a silicon wafer, and "soft-baked." Then, the photoresist is exposed to light using exposure equipment with ArF, KrF, E-beam, EUV or X-ray radiation, and "post-baked" at a temperature of about 70° C. to 120° C. for about 1 to 2 minutes. Then, the wafer is developed in a 2.38 wt % aqueous TMAH (tetramethylammonium hydroxide) solution, to obtain a negative micro pattern of 0.15 µm or less.

By the use of the photoresist copolymer and cross-linker according to the present invention: (i) a negative photoresist composition can be prepared which shows excellent photosensitivity and is developable with alkaline developing solution; and (ii) an ultra-micro pattern can be obtained in lithography process employing a light source of extremely short wavelength.

DETAILED DESCRIPTION OF PREFERRED EMBODIMENT

Now, specific examples of preferable photoresist copolymers useful in the present invention and processes for preparing the same, are described. However, it should be noted that the present invention is not restricted to these examples.

EXAMPLE 1

Synthesis of poly[2-hydroxyethyl 5-norbornene-2-carboxylate/maleic anhydride/tert-butyl 5-norbornene-2-carboxylate]

Maleic anhydride (0.1 mole), 2-hydroxyethyl 5-norbornene-2-carboxylate (0.04 mole), tert-butyl 5-norbornene-2-carboxylate (0.06 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was slowly added to 1 liter of ether with stirring to obtain the compound a white powder. This compound was filtered and dried to obtain the polymer represented by the following Chemical Formula 5 (yield: 41%).

<Chemical Formula 5>

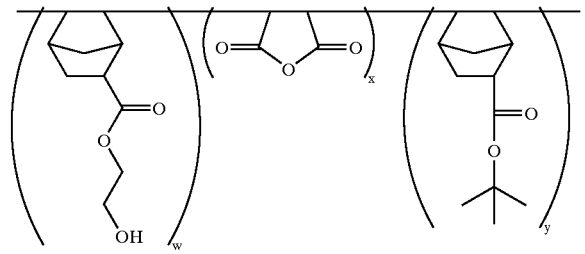

EXAMPLE 2

Synthesis of poly[2-hydroxyethyl bicyclo[2.2.2]oct-5-ene-carboxylate/maleic anhydride/tert-butyl 5-norbornene-2-carboxylate]

Maleic anhydride (0.1 mole), 2-hydroxyethyl bicyclo[2.2.2]oct-5-ene-2-carboxylate (0.04 mole), tert-butyl 5-norbornene-2-carboxylate (0.06 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 6 (yield: 37%).

<Chemical Formula 6>

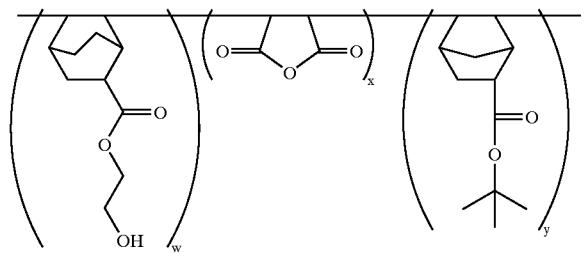

EXAMPLE 3

Synthesis of poly[2-hydroxyethyl 5-norbornene-2-carboxylate/maleic anhydride/tert-butyl bicyclo[2.2.2]oct-5-ene-2-carboxylate]

Maleic anhydride (0.1 mole), 2-hydroxyethyl 5-norbornene-2-carboxylate (0.04 mole), tert-butyl bicyclo[2.2.2]oct-5-ene-2-carboxylate (0.06 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 7 (yield: 35%).

<Chemical Formula 7>

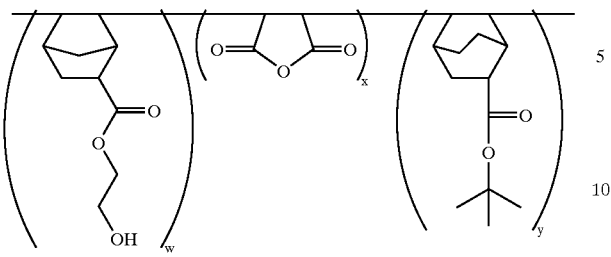

EXAMPLE 4

Synthesis of poly[2-hydroxyethyl bicyclo[2.2.2]oct-5-ene-carboxylate/maleic anhydride/t-butyl bicyclo[2.2.2]oct-5-ene-2-carboxylate]

Maleic anhydride (0.1 mole), 2-hydroxyethyl bicyclo[2.2.2]oct-5-ene-2-carboxylate (0.04 mole), tert-butyl bicyclo[2.2.2]oct-5-ene-2-carboxylate (0.06 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 8 (yield: 37%).

<Chemical Formula 8>

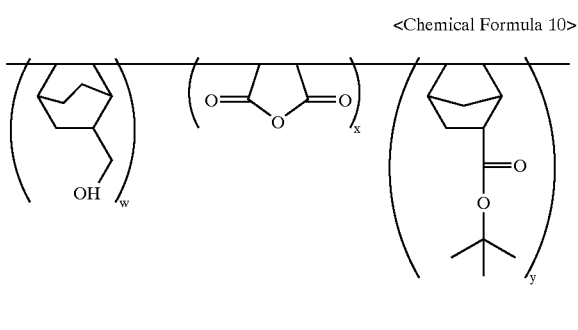

EXAMPLE 5

Synthesis of poly[5-norbornene-2-methanol/maleic anhydride/tert-butyl 5-norbornene-2-carboxylate]

Maleic anhydride (0.1 mole), 5-norbornene-2-methanol (0.06 mole), tert-butyl 5-norbornene-2-carboxylate (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 9 (yield: 40%).

<Chemical Formula 9>

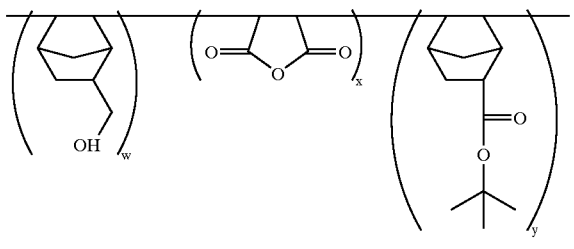

EXAMPLE 6

Synthesis of poly[bicyclo[2.2.2]oct-5-ene-2-methanol/maleic anhydride/tert-butyl5-norbornene-2-carboxylate]

Maleic anhydride (0.1 mole), 5-norbornene-2-methanol (0.06 mole), tert-butyl 5-norbornene-2-carboxylate (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 10 (yield: 37%).

<Chemical Formula 10>

EXAMPLE 7

Synthesis of poly[5-norbornene-2-methanol/maleic anhydride/tert-butyl bicyclo[2.2.2]oct-5-ene-2-carboxylate]

Maleic anhydride (0.1 mole), 5-norbornene-2-methanol (0.06 mole), tert-butyl bicyclo[2.2.2]oct-5-ene-2-carboxylate (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 11 (yield: 39%).

<Chemical Formula 11>

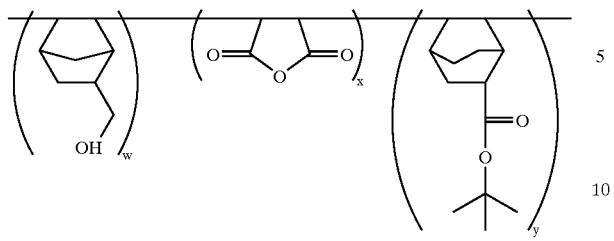

EXAMPLE 8

Synthesis of poly[bicyclo[2.2.2]oct-5-ene-2-methanol/maleic anhydride/tert-butyl bicyclo[2.2.2]oct-5-ene-2-carboxylate]

Maleic anhydride (0.1 mole), bicyclo[2.2.2]oct-5-ene-2-methanol (0.06 mole), tert-butyl bicyclo[2.2.2]oct-5-ene-2-carboxylate (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 12 (yield: 37%).

<Chemical Formula 12>

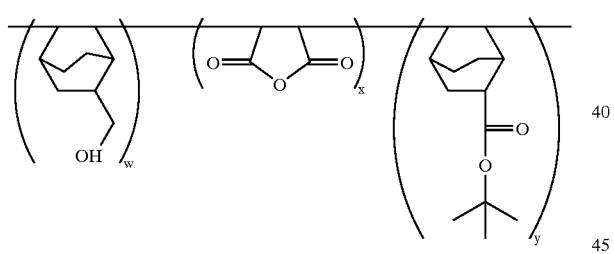

EXAMPLE 9

Synthesis of poly[2-hydroxyethyl 5-norbornene-2-carboxylate/5-norbornene-2-methanol/maleic anhydride/tert-butyl 5-norbornene-2-carboxylate]

Maleic anhydride (0.1 mole), 2-hydroxyethyl 5-norbornene-2-carboxylate (0.04 ml), 5-norbornene-2-methanol (0.04 mole), tert-butyl 5-norbornene-2-carboxylate (0.02 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 13 (yield: 37%).

<Chemical Formula 13>

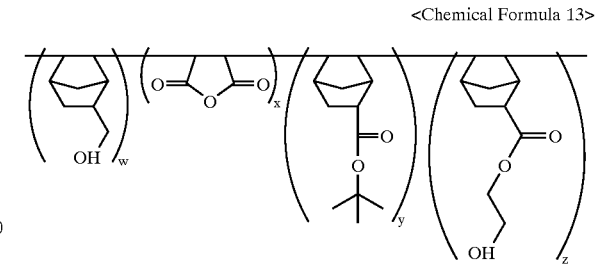

EXAMPLE 10

Synthesis of poly[2-hydroxyethyl bicyclo[2.2.2]oct-5-ene-2-carboxylate/5-norbornene-2-methanol/maleic anhydride/tert-butyl 5-norbornene-2-carboxylate]

Maleic anhydride (0.1 mole), 2-hydroxyethyl bicyclo[2.2.2]oct-5-ene-2-carboxylate (0.04 ml), 5-norbornene-2-methanol (0.04 mole), tert-butyl 5-norbornene-2-carboxylate (0.02 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 14 (yield: 39%).

<Chemical Formula 14>

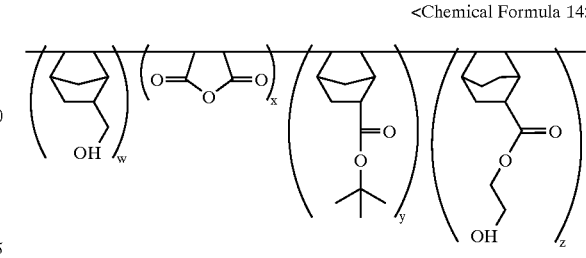

EXAMPLE 11

Synthesis of poly[2-hydroxyethyl 5-norbornene-2-carboxylate/5-norbornene-2-methanol/maleic anhydride/tert-butyl bicyclo[2.2.2]oct-5-ene-2-carboxylate]

Maleic anhydride (0.1 mole), 2-hydroxyethyl 5-norbornene-2-carboxylate (0.04 ml), 5-norbornene-2-methanol (0.04 mole), tert-butyl bicyclo[2.2.2]oct-5-ene-2-carboxylate (0.02 mole), and 2,2'-azobisisobutyronitrile (AIBN) (0.03 g) were dissolved in 30 ml of tetrahydrofuran, and the solution was reacted at 68° for 8 hours. After the reaction was completed, the reaction mixture was treated by the same procedure as Example 1 to obtain the polymer represented by the following Chemical Formula 15 (yield: 37%).

<Chemical Formula 15>

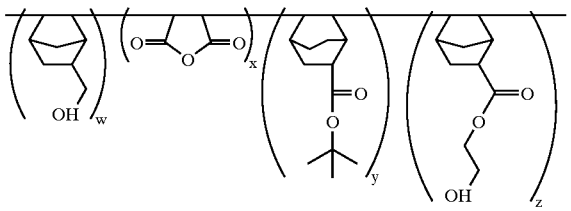

<Chemical Formula 17>

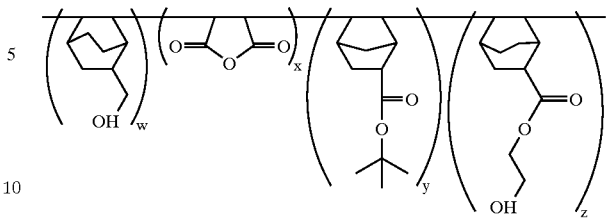

EXAMPLE 12

Synthesis of poly[2-hydroxyethyl bicyclo[2.2.2]oct-5-ene-2-carboxylate/5-norbornene-2-methanol/maleic anhydride/tert-butyl bicyclo[2.2.2]oct-5-ene-2-carboxylate]

Maleic anhydride (0.1 mole), 2-hydroxyethyl bicyclo[2.2.2]oct-5-ene-2-carboxylate (0.04 ml), 5-norbornene-2-methanol (0.04 mole), tert-butyl bicyclo[2.2.2]oct-5-ene-2-carboxylate (0.02 mole), and 2,2'-azobisisobutyronitrile (AIBN) (0.03 g) were dissolved in 30 ml of tetrahydrofuran, and the solution was reacted at 68° for 8 hours. After the reaction was completed, the reaction mixture was treated by the same procedure as Example 1 to obtain the polymer represented by the following Chemical Formula 16 (yield: 33%).

EXAMPLE 14

Synthesis of poly[2-hydroxyethyl bicyclo[2.2.2]oct-5-ene-2-carboxylate/bicyclo[2.2.2]oct-5-ene-2-methanol/maleic anhydride/tert-butyl bicyclo[2.2.2]oct-5-ene-2-carboxylate]

Maleic anhydride (0.1 mole), 2-hydroxyethyl bicyclo[2.2.2]oct-5-ene-2-carboxylate (0.04 ml), bicyclo[2.2.2]oct-5-ene-2-methanol (0.04 mole), tert-butyl bicyclo[2.2.2]oct-5-ene-2-carboxylate (0.02 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 18 (yield: 31%).

<Chemical Formula 16>

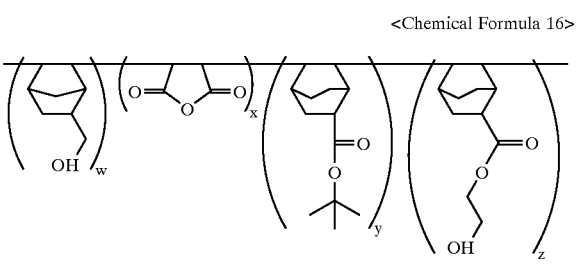

<Chemical Formula 18>

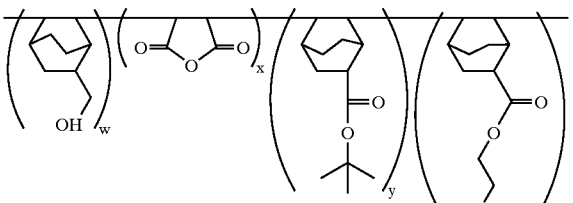

EXAMPLE 13

Synthesis of poly[2-hydroxyethyl bicyclo[2.2.2]oct-5-ene-2-carboxylate/bicyclo[2.2.2]oct-5-ene-2-methanol/maleic anhydride/tert-butyl 5-norbornene-2-carboxylate]

Maleic anhydride (0.1 mole), 2-hydroxyethyl bicyclo[2.2.2]oct-5-ene-2-carboxylate (0.04 ml), bicyclo[2.2.2]oct-5-ene-2-methanol (0.04 mole), tert-butyl 5-norbornene-2-carboxylate (0.02 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 17 (yield: 35%).

EXAMPLE 15

Synthesis of poly[2-hydroxyethyl 5-norbornene-2-carboxylate/bicyclo[2.2.2]oct-5-ene-2-methanol/maleic anhydride/tert-butyl bicyclo[2.2.2]oct-5-ene-2-carboxylate]

Maleic anhydride (0.1 mole), 2-hydroxyethyl 5-norbornene-2-carboxylate (0.04 ml), tert-butyl bicyclo[2.2.2]oct-5-ene-2-carboxylate (0.02 mole), bicyclo[2.2.2]oct-5-ene-2-methanol (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 19 (yield: 36%).

<Chemical Formula 19>

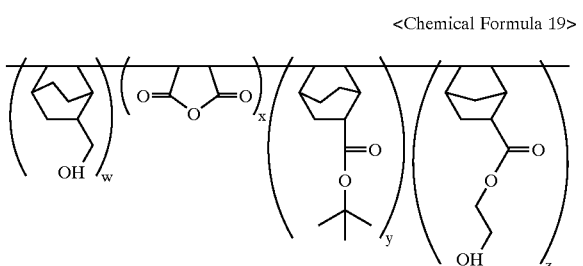

EXAMPLE 16

Synthesis of poly[2-hydroxyethyl 5-norbornene-2-carboxylate/bicyclo[2.2.2]oct-5-ene-2-methanol/maleic anhydride/tert-butyl 5-norbornene-2-carboxylate]

Maleic anhydride (0.1 mole), 2-hydroxyethyl 5-norbornene-2-carboxylate (0.04 ml), tert-butyl 5-norbornene-2-carboxylate (0.02 mole), bicyclo[2.2.2]oct-5-ene-2-methanol (0.04 mole), and 2,2'-azobisisobutyronitrile (AIBN) (0.03 g) were dissolved in 30 ml of tetrahydrofuran, and the solution was reacted at 68° C. for 8 hours. After the reaction was completed, the reaction mixture was treated by the same procedure as Example 1 to obtain the polymer represented by the following Chemical Formula 20 (yield: 39%).

<Chemical Formula 20>

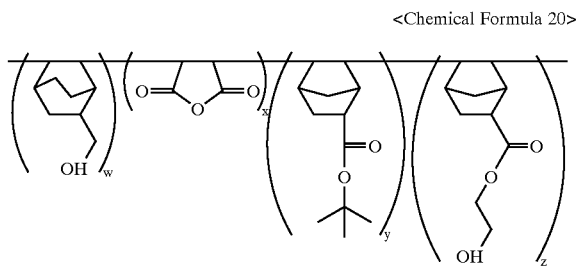

EXAMPLE 17

The polymer obtained from Example 1 (5 g), triphenylsulfonium triflate (0.1 g) as a photoacid generator, and 95% glutaric dialdehyde (1 ml) as a cross-linker were dissolved in 24 ml of methyl 3-methoxypropionate with stirring. The solution was filtered through a 0.1 μm filter to prepare a photoresist composition, which was coated on a silicon wafer to form a photoresist film and soft-baked. The photoresist was exposed to patterned ArF radiation and post-baked at a temperature of about 70° C.–120° C. for about 1–2 minutes. Then, the wafer was developed in 2.38 wt % aqueous TMAH solution. The resolution of the negative pattern thus obtained was 0.14 μm (FIG. 1).

EXAMPLE 18

Figure 2:
FIG. 2 shows a photoresist pattern obtained from Example 18.

The procedure according to Example 17 was repeated, but using the same amount of the polymer obtained from Example 2 instead of the polymer obtained from Example 1, to obtain a negative pattern with a resolution of 0.14 μm (FIG. 2).

EXAMPLE 19

Figure 3:
FIG. 3 shows a photoresist pattern obtained from Example 19.

The procedure according to Example 17 was repeated, but using the same amount of the polymer obtained from Example 10 instead of the polymer obtained from Example 1; 1,4-cyclohexane dicarboxaldehyde (1.4 g) as a cross-linker instead of glutaric dialdehyde, and methyl 3-methylpropionate (25 ml) as a solvent, to obtain a negative pattern with a resolution of 0.15 μm (FIG. 3).

What is claimed is:

1. A photoresist composition comprising a photoresist polymer having one or more hydroxyl groups and a cross-linker compound having two or more aldehyde groups and a photoacid generator.

2. A photoresist composition according to claim 1 wherein the cross-linker comprises a compound represented by Chemical Formula 1:

OHC—R'—CHO           <Chemical Formula 1> wherein, R' represents $C_{1-10}$ aliphatic or alicyclic alkyl.

3. A photoresist composition according to claim 2 wherein the cross-linker comprises glutaric dialdehyde or 1,4-cyclohexane dicarboxaldehyde.

4. A photoresist composition comprising (i) a cross-linker having two or more aldehyde groups, (ii) a photoresist copolymer having hydroxyl group(s), (iii) a photoacid generator and (iv) an organic solvent.

5. A photoresist composition according to claim 4, wherein the photoresist copolymer comprises an alicyclic monomer(s) having hydroxyl group(s) represented by the following Chemical Formula 2:

<Chemical Formula 2>

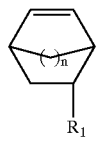

wherein, $R_1$ is —$(CH_2)_p$—OH or —COO—$(CH_2)_q$—OH; n is the number 1 or 2; p is a number from 1 to 5; and q is a number from 1 to 3.

6. A photoresist composition according to claim 5, wherein the photoresist copolymer further comprises maleic anhydride as a co-monomer.

7. A photoresist composition according to claim 6, wherein the photoresist copolymer further comprises a monomer represented by following Chemical Formula 3:

<Chemical Formula 3>

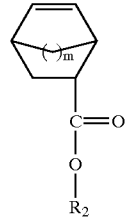

wherein, $R_2$ represents tert-butyl, tetrahydropiranyl, ethoxyethyl, acetoxy ethoxyethyl, tetrahydrofuranyl or acetoxymethyl, and m is 1 or 2.

8. A photoresist composition according to claim 7, wherein the copolymer is selected from the group consisting of poly(2-hydroxyethyl 5-norbornene-2-carboxylate/maleic anhydride/tert-butyl 5-norbornene-2-carboxylate), poly(2-hydroxyethyl bicyclo[2.2.2]oct-5-ene-2-carboxylate/maleic anhydride/tert-butyl 5-norbornene-2-carboxylate), poly(2-hydroxyethyl 5-norbornene-2-carboxylate/maleic anhydride/tert-butyl bicyclo[2.2.2]oct-5-ene-2-carboxylate), poly(2-hydroxyethyl bicyclo[2.2.2]oct-5-ene-2-carboxylate/ maleic anhydride/tert-butyl bicyclo[2.2.2]oct-5-ene-2-carboxylate), poly(5-norbornene-2-methanol/maleic anhydride/tert-butyl 5-norbornene-2-carboxylate), poly (bicyclo[2.2.2]oct-5-ene-2-methanol/maleic anhydride/tert-butyl 5-norbornene-2-carboxylate), poly(5-norbornene-2-methanol/maleic anhydride/tert-butyl bicyclo[2.2.2]oct-5-ene-2-carboxylate), poly(bicyclo[2.2.2]oct-5-ene-2-methanol/maleic anhydride/tert-butyl bicyclo[2.2.2]oct-5-ene-2-carboxylate), poly(2-hydroxyethyl 5-norbornene-2-carboxylate/5-norbornene-2-methanol/maleic anhydride/tert-butyl 5-norbornene-2-carboxylate), poly(2-hydroxyethyl bicyclo[2.2.2]oct-5-ene-2-carboxylate/5-norbornene-2-methanol/maleic anhydride/tert-butyl 5-norbornene-2-carboxylate), poly(2-hydroxyethyl 5-norbornene-2-carboxylate/5-norbornene-2-methanol/ maleic anhydride/tert-butyl bicyclo[2.2.2]oct-5-ene-2-carboxylate), poly(2-hydroxyethyl bicyclo[2.2.2]oct-5-ene-2-carboxylate/5-norbornene-2-methanol/maleic anhydride/ tert-butyl bicyclo[2.2.2]oct-5-ene-2-carboxylate), poly(2-hydroxyethyl bicyclo[2.2.2]oct-5-ene-2-carboxylate/bicyclo [2.2.2]oct-5-ene-2-methanol/maleic anhydride/tert-butyl 5-norbornene-2-carboxylate), poly(2-hydroxyethyl bicyclo [2.2.2]oct-5-ene-2-carboxylate/bicyclo[2.2.2]oct-5-ene-2-methanol/maleic anhydride/tert-butyl bicyclo[2.2.2]oct-5-ene-2-carboxylate), poly(2-hydroxyethyl 5-norbornene-2-carboxylate/bicyclo[2.2.2]oct-5-ene-2-methanol/maleic anhydride/tert-butyl bicyclo[2.2.2]oct-5-ene-2-carboxylate), and poly(2-hydroxyethyl 5-norbornene-2-carboxylate/ bicyclo[2.2.2]oct-5-ene-2-methanol/maleic anhydride/tert-butyl 5-norbornene-2-carboxylate).

9. A photoresist composition according to claim 4, wherein the photoresist copolymer is represented by following Chemical Formula 4:

<Chemical Formula 4>

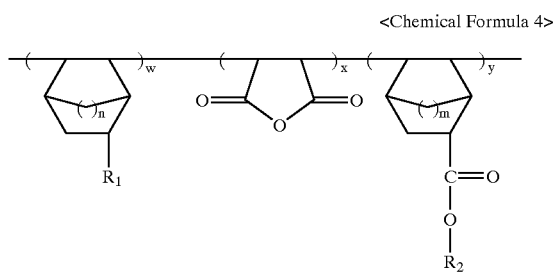

wherein, $R_1$ is —$(CH_2)_p$—OH or —COO—$(CH_2)_q$—OH; $R_2$ represents tert-butyl, tetrahydropiranyl, ethoxyethyl, acetoxyethoxyethyl, tetrahydrofuranyl or acetoxymethyl; m and n individually represent 1 or 2; p is a number from 1 to 5; q is a number from 1 to 3; and w, x and y individually are greater than 0 and represent the number of units of each comonomer.

10. A photoresist composition according to claim 9, wherein the ratio w:x:y is(10–48):50:(2–40) by mol %.

11. A photoresist composition according to claim 4, wherein the photoacid generator is one or more compound (s) selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate.

12. A photoresist composition according to claim 4, wherein the photoacid generator is present in an amount of 1 to 20% by weight of the copolymer.

13. A photoresist composition according to claim 4, wherein the organic solvent is selected from the group consisting of ethyl lactate, propylene glycol methyl ether acetate, ethyl methyl ketone, methyl 3-methoxypropionate, ethyl 3-ethoxypropionate and 2-ethoxyethyl acetate.

14. A photoresist composition according to claim 4, wherein the organic solvent is present in an amount of 200 to 800% by weight of said copolymer.

15. A photoresist composition according to claim 4, wherein the cross-linker is present in an amount of 10 to 30% by weight of said copolymer.

16. A process for forming a photoresist pattern, which comprises the steps of (a) coating a photoresist composition according to claim 4 on a wafer to form a photoresist film, (b) exposing the wafer to light by employing an exposer, and (c) developing the exposed wafer to obtain a negative photoresist pattern.

17. A process according to claim 16, wherein the step (b) is carried out by using a light source selected from the group consisting of ArF, KrF, E-beam, EUV (extremely ultraviolet), ion-beam and X-ray radiation.

18. A process according to claim 16, wherein the developing step is carried out by using aqueous TMAH (tetramethylammonium hydroxide) solution.

19. A method for producing a negative photoresist composition which comprises mixing a photoresist polymer having one or more hydroxyl groups and a cross-linker compound having two or more aldehyde groups in the presence of a photoacid generator.

* * * * *